United States Patent [19]
Boles

[11] Patent Number: 6,130,471
[45] Date of Patent: Oct. 10, 2000

[54] BALLASTING OF HIGH POWER SILICON-GERMANIUM HETEROJUNCTION BIPLOAR TRANSISTORS

[75] Inventor: Timothy Edward Boles, Tyngsboro, Mass.

[73] Assignee: The Whitaker Corporation, Wilmington, Del.

[21] Appl. No.: 08/920,640

[22] Filed: Aug. 29, 1997

[51] Int. Cl.[7] ...................... H01L 27/082; H01L 27/102; H01L 29/70; H01L 31/11
[52] U.S. Cl. ......................... 257/577; 257/580; 257/581; 257/582; 257/586
[58] Field of Search ................... 257/580, 581, 257/582, 586, 577

[56] References Cited

U.S. PATENT DOCUMENTS

| | | | |
|---|---|---|---|
| 4,526,593 | 7/1985 | Meyerson | 55/385 |
| 4,647,494 | 3/1987 | Meyerson et al. | 428/216 |
| 5,008,207 | 4/1991 | Blouse et al. | 437/31 |
| 5,031,029 | 7/1991 | Acocella et al. | 357/81 |
| 5,159,508 | 10/1992 | Grill et al. | 360/103 |
| 5,246,884 | 9/1993 | Jaso et al. | 437/225 |
| 5,259,918 | 11/1993 | Akbar et al. | 156/610 |
| 5,316,958 | 5/1994 | Meyerson | 437/31 |
| 5,319,240 | 6/1994 | Faure et al. | 257/622 |
| 5,322,813 | 6/1994 | Beach | 437/88 |
| 5,378,922 | 1/1995 | Sovero | 257/582 |
| 5,461,243 | 10/1995 | Elk et al. | 257/190 |
| 5,534,079 | 7/1996 | Beach | 148/33 |
| 5,540,785 | 7/1996 | Dennard et al. | 148/33.2 |
| 5,607,511 | 3/1997 | Meyerson | 118/275 |
| 5,734,193 | 3/1998 | Bayraktaroglu et al. | 257/579 |
| 5,760,457 | 6/1998 | Mitsui et al. | 257/582 |
| 5,864,169 | 1/1999 | Shimura et al. | 257/587 |

OTHER PUBLICATIONS

Scientific American, Mar. 1994, Bernard S. Meyerson, pp.62–67.
Physics Today, Oct. 1986, John C, Bean, pp. 36–42.
IEEE Electron Device Letters, vol. 11, No. 7, Jul. 1990, Joachim N. Burghartz, et al., pp. 288–290.
IEEE Transactions on Electron Devices, vol. 41, No. 6, Jun. 1994, Dietrich Vook, et al, pp. 1013–1017.
Jpn. J. Appl. Phys, vol. 32, 1993, Pt. 1., No. 3A, Takeshi Karasawa, et al., pp. 1039–1044.
Periodical Applied Microwave & Wireless, Summer 1994, G. Dawe, et al., pp. 14,15,17,18,20,23,24.
IEEE Spectrum article, Mar. 1995, John D. Cressler, pp. 49–55.
IEEE Electron Device Letters, vol. 16, No. 5, May 1995, K. D. Hobart, et al., pp. 205–207.
IEEE Electron Device Letters, vol. 13, No. 5, May 1995, Emmanuel F. Crabbé, et al., pp. 259–261.
IEEE 1993 Bipolar Circuits and Technology Meeting 4.1, J. N. Burghartz, et al., pp. 55–62, 1993.

*Primary Examiner*—William Mintel

[57] ABSTRACT

A ballasted transistor structure reduces thermal runaway. A heterojunction bipolar junction transistor array includes a plurality of transistors, each having an emitter, a base and a collector. Each of the bases is an alloy of silicon and germanium and each of the collectors and emitters is silicon. A ballast resistor, of doped silicon, that prevents thermal runaway, is electrically connected to each of the collectors.

8 Claims, 6 Drawing Sheets

Fig. 1
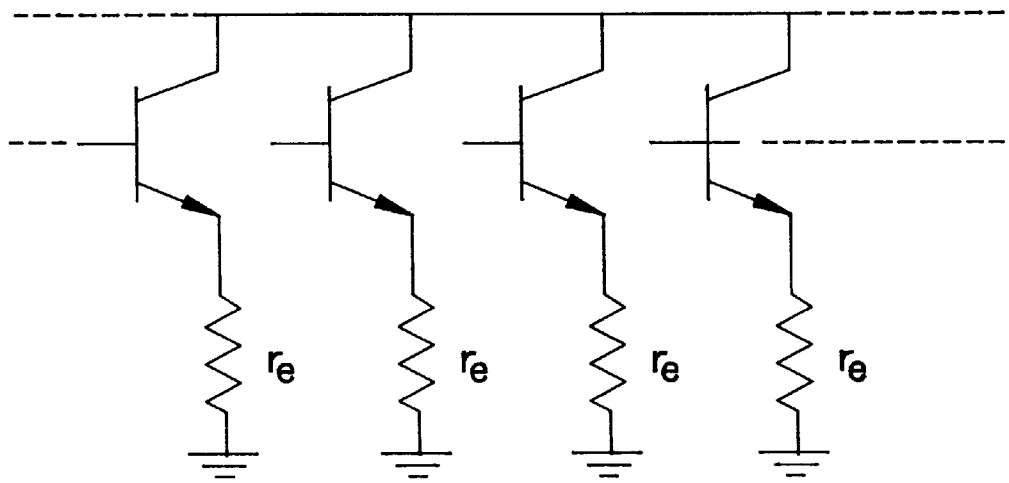
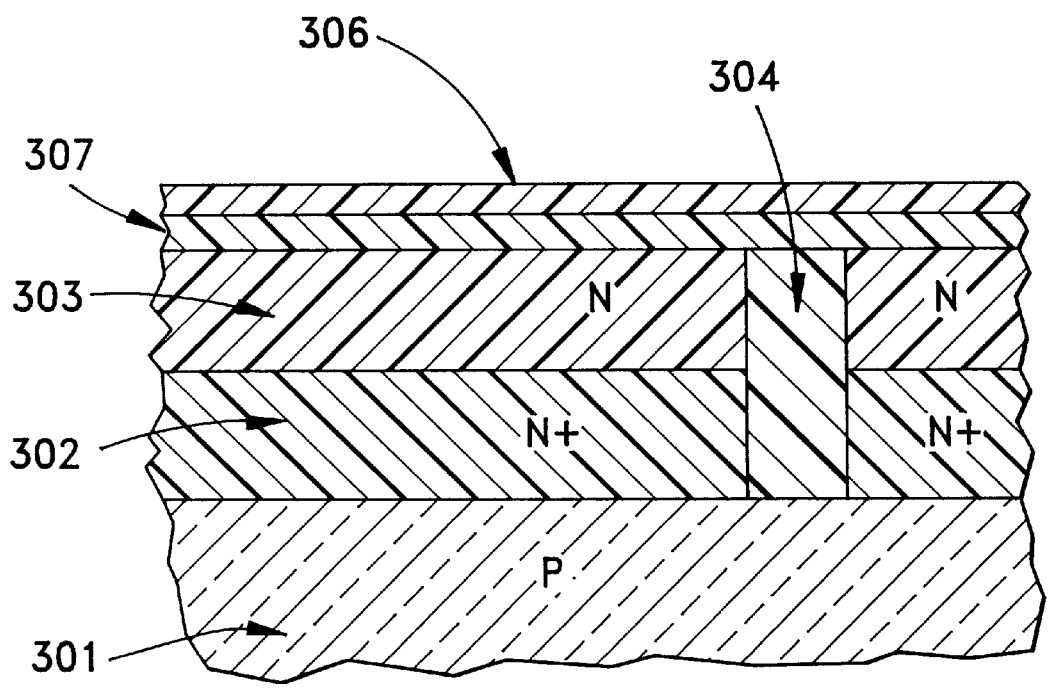
Fig. 11

BALLASTING OF HIGH POWER SILICON-GERMANIUM HETEROJUNCTION BIPLOAR TRANSISTORS

FIELD OF THE INVENTION

The present invention relates to a ballasted transistor structure for reducing thermal runaway.

BACKGROUND OF THE INVENTION

Silicon germanium epitaxially grown alloys provide a promising solution to high frequency, high speed devices in readily available, low cost silicon-based structures. The evolution of silicon germanium materials and technologies has occurred quickly. With cutoff frequencies in excess of 100 GHz, silicon-germanium can achieve switching speeds of comparable III–V semiconductor devices. The energy bandgap of an alloy of silicon-germanium is smaller than it is for silicon, lying between the intrinsic bandgap of silicon (1.12 eV) and germanium (0.66 eV). The bandgap is reduced further by the compressive strain in the alloy layer, with the bandgap being reduced still further with increasing germanium content.

In strained lattice structure silicon-germanium alloys, grown on a silicon substrate, a bandgap reduction is due to a valence band offset. The conduction and valence band edges of the strained layers of the alloy of silicon-germanium lie within the band edges of the underlying silicon, which has attendant benefits in bandgap engineering to fabricate fast switching speed transistors. Furthermore, the low pressure chemical vapor deposition technique employed by Myerson et al. as is disclosed in U.S. Pat. No. 5,298,452, the disclosure which is specifically incorporated herein by reference, allows for a controlled grading of germanium concentration across the base layer.

The smaller bandgap of the alloy of silicon and germanium in a heterojunction bipolar transistor (HBT) is utilized as follows. The reduction in the base bandgap due to the intrinsically reduced bandgap of the silicon-germanium alloy compared to silicon is produced at the emitter-base junction. The base bandgap junction exponentially increases the collector current for a particular bias voltage, resulting in a large increase in current gain when compared with bipolar homojunction transistors in silicon. By adding the germanium to the emitter-base junction, the potential barrier is lower at the junction, and for a given bias voltage, more electrons are injected from the emitter to the base where they contribute to the collector current. Additionally, by grading the junction across the base region, the conduction band edge in the base becomes dependent upon the position in the base, resulting in an electrostatic field within the base region. The electrostatic field accelerates the injected minority carriers traversing the base. This reduces the base transit time and significantly increases the frequency response of the device. Additionally, the silicon germanium alloy in the base region improves the output resistance of the transistor.

While silicon germanium alloys have met with great success in a variety of HBT structures and applications, it is desirable to utilize such a structure in high power applications. As is well known to one of ordinary skill in the art, ballasting is often necessary in high power transistor applications. To this end, with higher power, higher temperatures of operation result in an increased current at the collector which in turn increases the temperature of the device. The relationship between PN junction diode current and temperature is well known, and clearly the increase in temperature results in an increase in current which in turn results in an increase in temperature. This self-feeding problem is known as thermal runaway and must be remedied. Furthermore, in power devices, thermal runaway occurs because parallel devices are not all identical and do not have identical heat dissipation capability. When one HBT get slightly hotter than a neighboring device, it begins to carry more current, which results in an increase in its temperature, which increases its current, and so forth. This unstable condition can rapidly lead to the destruction of the operation of the entire device. As a particular unit device is destroyed, the remaining devices begin to carry more current which increases the temperature and increases the likelihood of their ultimate destruction. A generally accepted way of controlling thermal runaway problems is to place a fixed resistance in series with each emitter of the transistors which are connected in parallel. This emitter resistance is preferably identical in each transistor with a magnitude of three to ten times the intrinsic impedance of the device. In this manner, the current level in each transistor is essentially the same.

Conventional methods used to fabricate emitter resistance in power devices is, for example, the fabrication of a NiCr thin film metal resistor connected to the emitter by well known techniques. Unfortunately, thin film metals in power devices often end up acting as mere fuses. In order to circumvent this problem, thicker metal films were tried, to handle the current levels of power devices. Unfortunately, due to the relatively low sheet resistance of the thick metal films, this approach results in physically long resistors which can add unwanted parasitic inductance levels at higher frequencies. One possible alternative technique for fabricating emitter resistance for ballasting is the use of polysilicon which is appropriately doped to the proper resistance level. For example, doping polysilicon with a suitable dopant of boron, arsenic, or phosphorous is an alternative to metal resistors. However, certain process issues are raised during this fabrication step. As stated earlier, the reduction in the bandgap of silicon-germanium is put to great use in the HBT structure of Si-SiGe-Si structures. While the reduction in the bandgap of a silicon-germanium alloy is partly due to the fact that germanium reduces the silicon bandgap, it is of course important to note that the bandgap is further reduced by the compressive strain in the alloy layer. To this end, as stated above, the bandgap is reduced even further with increasing germanium content than might otherwise be expected. At high temperatures, the silicon-germanium lattice structure of the alloy relaxes, reducing significantly the benefit gained in the bandgap engineered via the strained layers of silicon-germanium. Accordingly, in the fabrication of ballast resistors, it is necessary to avoid exposing of the silicon-germanium alloy to high termperatures. One possible approach would be to fabricate the resistors at a low temperature. Unfortunately, for the sheet resistance values desired, on the order of 50–250 Ohm/square conductivities cannot be achieved at low temperatures.

Accordingly, what is needed is a technique which enables the fabrication of ballast resistors in polysilicon in a manner so as not to relax the strained layers in the lattice of the silicon-germanium transistor.

SUMMARY OF THE INVENTION

The present invention relates to a heterojunction bipolar transistor having polysilicon ballast resistors in contact with the emitter layers of parallel transistors for a high power application. The polysilicon layers are appropriately doped with a suitable dopant, for example boron, arsenic, or phosphorous into a desired thickness of polycrystalline silicon to effect a suitable resistance for ballasting. The base region of silicon-germanium is fabricated after the fabrication of the resistors, so that high temperature fabrication steps used in fabricating appropriate resistance levels in the ballast resistors are avoided. By doing this, a heterojunction bipolar transistor structure having ballast resistors can be effected without resulting in a relaxation of the lattice structures which reduces the strain and accordingly reduces the bend in the bandgap, which has a primary advantage in increasing the injection current in the base in a silicon-germanium structure.

BRIEF DESCRIPTION OF THE DRAWINGS

FIG. 1 shows a typical circuit for high power amplifier applications where the heterojunction bipolar transistors are connected in parallel and have ballast resistors connected to the emitters.

FIG. 11 shows a cross-sectional view of a structure utilizing a subcollector layer.

DETAILED DESCRIPTION OF THE INVENTION

Figure 3:
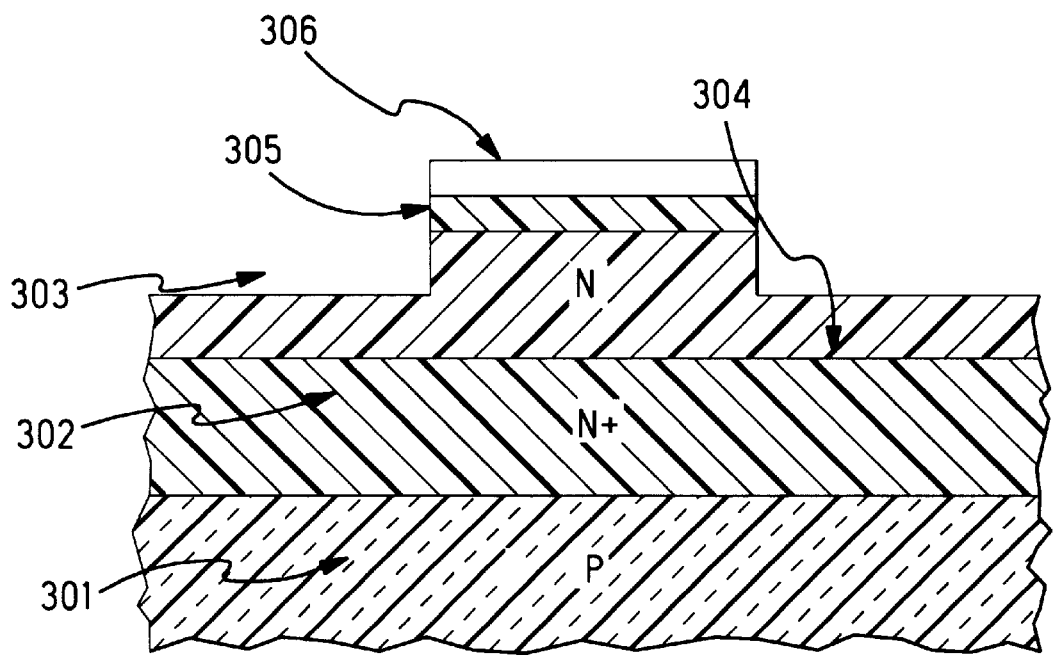

Turning to FIG. 11, a typical structure is shown in which an isolating p-type subcollector layer 301 has disposed thereon an epitaxially grown n+ collector contact layer 302 with a collector layer 303 epitaxially grown thereon. In structures such as shown in FIG. 12, an access or via region 304 of n+ silicon is grown for effecting contact with an ohmic contact layer (not shown). In many applications, the isolating sub-collector layer 301 can be forgone with direct contact made to the layer 302. For purposes of discussion, this will be the exemplary embodiment. After the growth of the n-type silicon collector layer 302 (as shown in FIG 3), consecutive layers of silicon dioxide 305 and silicon nitride 306 are grown. The pad oxide layer 305 is on the order of 200 angstroms in thickness, while the nitride layer is on the order of 1200 angstroms. The pad oxide layer is grown by conventional techniques, including conventional thermal oxidation techniques. The nitride layer can be fabricated using conventional chemical vapor deposition techniques, but is preferably deposited by low pressure chemical vapor deposition (LPCVD). The pad oxide layer has the nitride layer grown thereon to prevent further oxidation.

Figure 4:
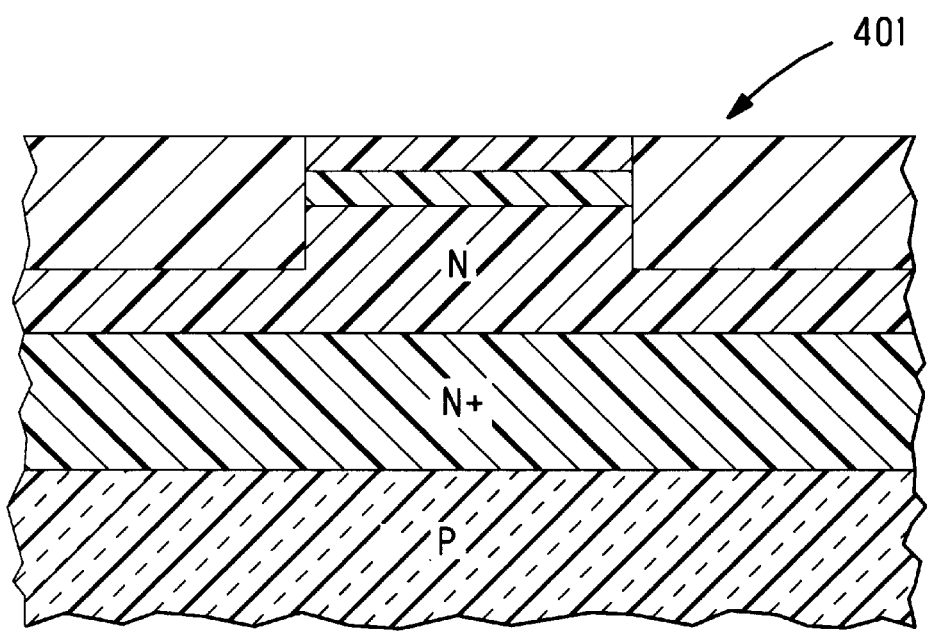
Figure 5:
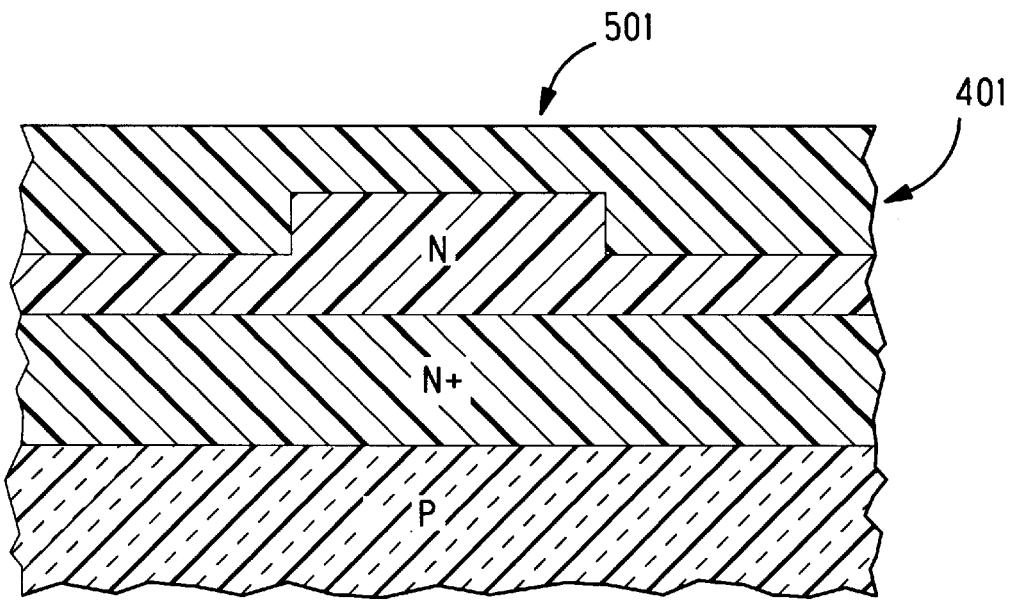

Turning to FIG. 3, the oxide and nitride layers 305, 306 are patterned and the n-type layer 303 is selectively etched for the formation of oxide. After this step, as shown in FIG. 4, a relatively thick layer of oxide 401 is grown by the technique of localized oxidation of silicon (LOCOS), well known to one of ordinary skill in the art. This is effected by standard technique, for example as is discussed in *VLSI Fabrication Principles Silicon and Gallium Arsenide*, 2$^{nd}$ Edition by Ghandi pp. 714–719, the disclosure which is specifically incorporated herein by reference. Thereafter, as is shown in FIG. 4, the remaining layers of nitride and oxide on the mesa, 305 and 306, respectively, are removed and a layer on the order of 400 angstroms of LOCOS is formed on the mesa. This layer of oxide 501 has a known thickness on the order of 400 angstroms. While the thickness is important, it is not critical and only has to be thick enough to prevent dry etch damage during the etch at the next step in the process and thin enough to not cause a deep hole for printing of the fine line structures at the emitter, base, collect or metallization step.

Figure 6:
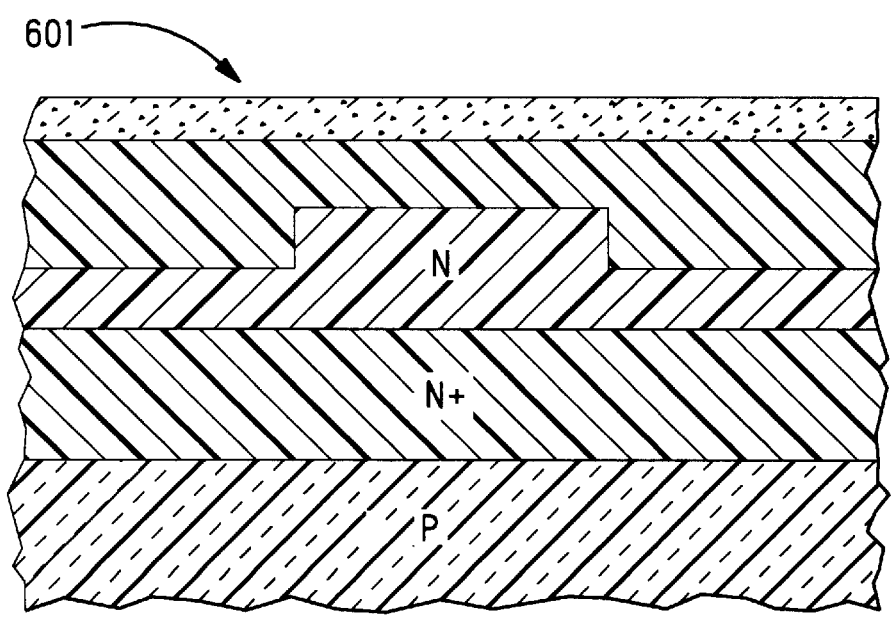

After the final fabrication of the oxide layer in appropriate thickness, a continuous film of polysilicon is deposited by standard techniques as is shown in FIG. 6 at 601. After the deposition of the polysilicon, boron, arsenic, or phosphorous is used as a dopant in selected regions of the polysilicon in order to fabricate the ballast resistors of the present disclosure. At this step, the dopant in the polysilicon film is activated at a relatively high temperature (on the order of 1050 degrees Celsius). If the silicon germanium base region had been fabricated prior to this step, the problems discussed above with the relaxation of the lattice would have occurred. However, by virtue of the suitable timing of this activation step, the problems of lattice relaxation are avoided.

Figure 7:
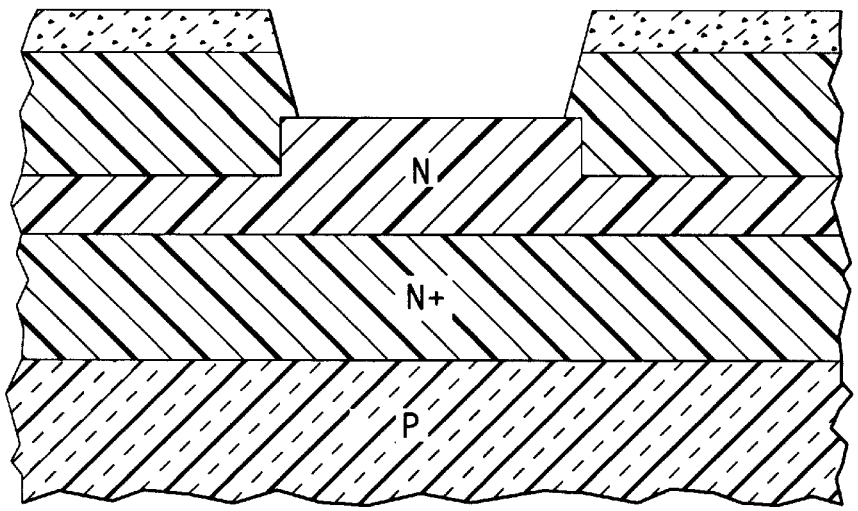
FIGS. 3–9 shows the fabrication steps to effect device according to the present disclosure.
Figure 2:
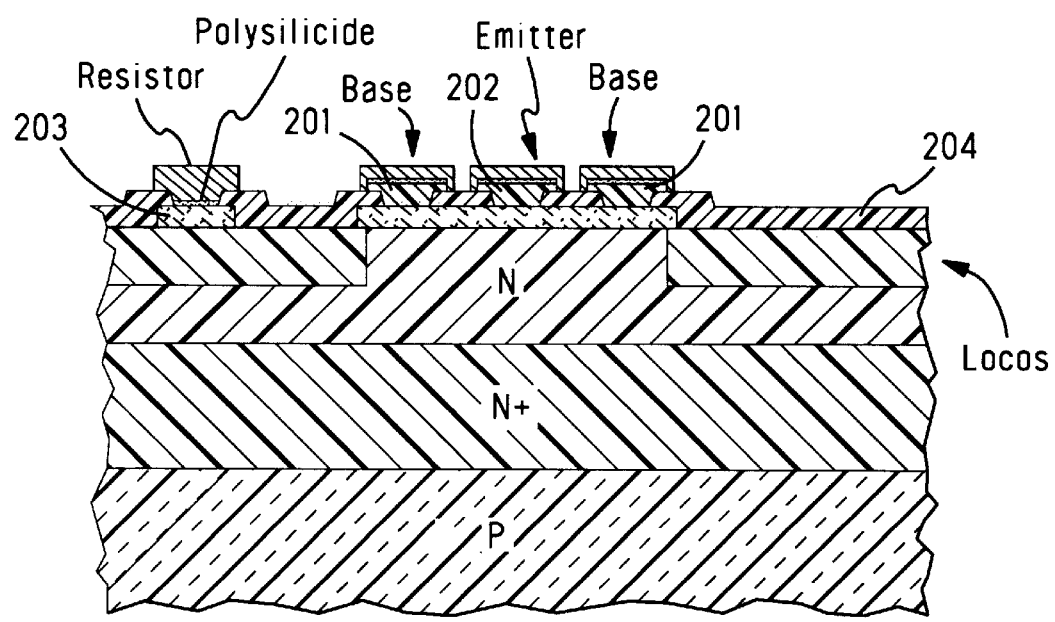
FIG. 2 shows is a cross-sectional view of the final structure of device according to of the present disclosure.
Figure 8:
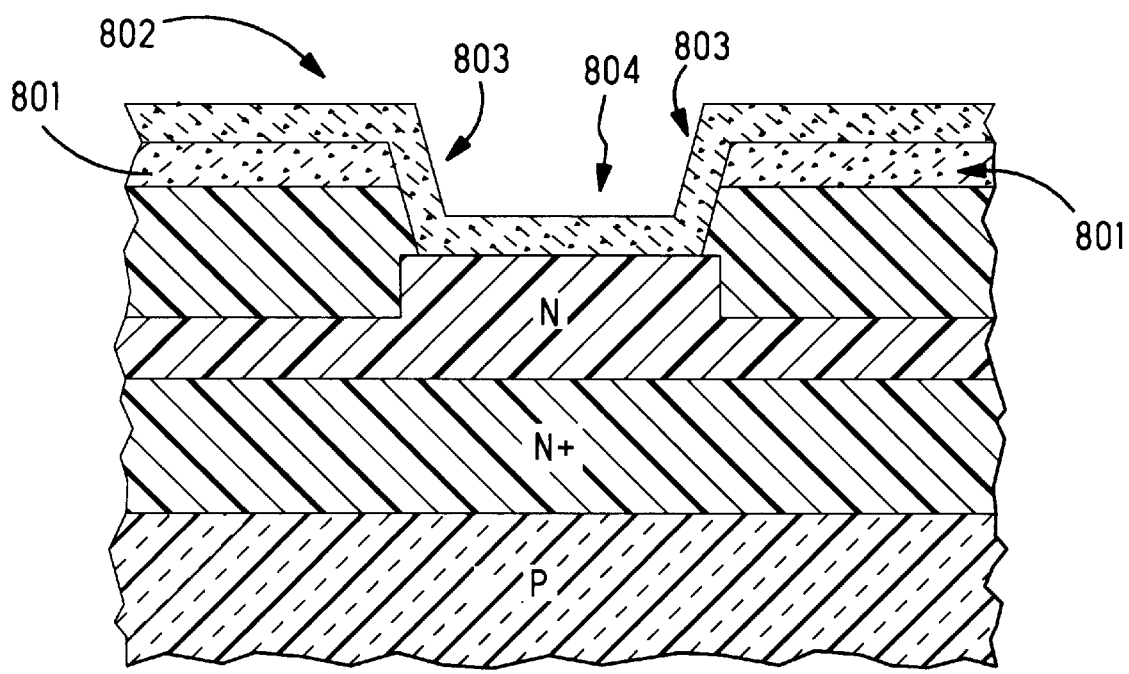
Figure 9:
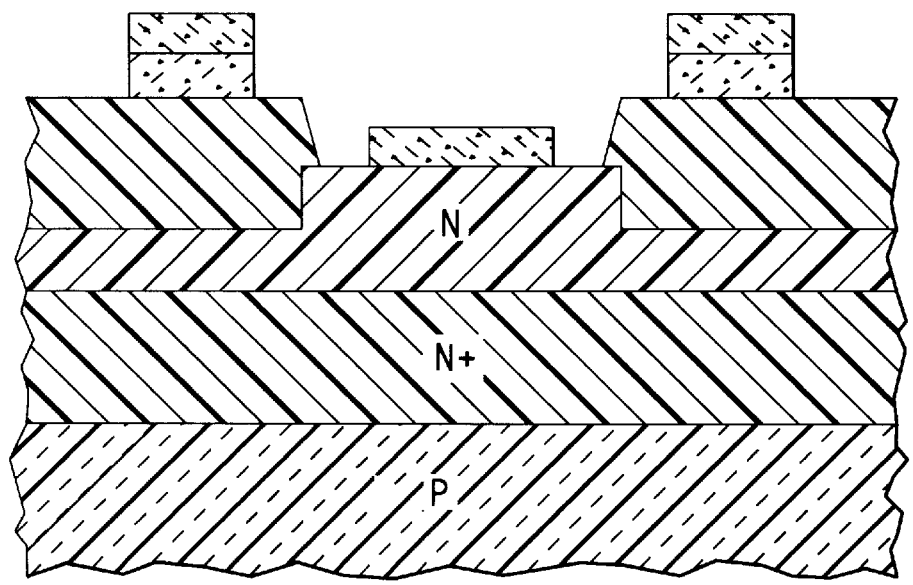

After a standard photo-resist/wet etch step to expose the mesa shown in FIG. 7, low pressure CVD, resulting in epitaxial layers of silicon-germanium, (by standard technique as is disclosed in the above referenced patent to Myerson), is carried out. As is shown in FIG. 8, in the regions where the polysilicon layer 801 has the silicon-germanium deposited thereon, a layer of polycrystalline silicon-germanium is formed. This is shown at 802. Furthermore, on the sidewalls shown at 803 of polysilicon and LOCOS oxide layer, polycrystalline silicon-germanium is fabricated. However, at the epitaxial layer of the mesa, single crystal silicon-germanium of high quality is fabricated as is shown at 804. This fabrication step which forms single crystal silicon-germanium on the single crystal silicon and polycrystalline silicon-germanium at all other places as shown in FIG. 8 is the subject of U.S. patent application Ser. No. (08/870,219) to Goodrich et al., the disclosure which is specially incorporated herein by reference. Finally, as shown in FIG. 9, selective etching is effected, leaving the single crystal silicon base 901 and regions with a layer of poly-silicon and poly Si—Ge 902. The final structure is shown in FIG. 2, illustrating the steps of depositing a photo-resist, patterning and the deposition of a low temperature oxide of a thickness on the order of 2000 angstroms. After the low temperature oxide is deposited, it is patterned and etched to open holes to form a self-aligned pattern for the emitter and base contacts to the silicon germanium layer and to contact the resistors. After formation of the self-aligned emitter, base contact, resistor contact pattern in the low temperature oxide 204, a second continuous film of polysilicon is deposited by standard techniques. After the deposition of the polysilicon, boron and phosphorous are selectively implanted into the polysilicon in the regions directly above the base contact openings and above the emitter openings, respectivly, using standard photolithographic processes as implantation masks. The implantation of boron and phosphorous as dopants into selected regions of the polysilicon serve to facilitate contact to the silicon-germanium base region and to form the heterojunction emitter structure respectively. The polysilcon is then patterned via standard photolithographic and etch processes. At this step, the boron and phosphorous dopants in the polysilicon film are activated at a relatively low temperature (800 C.) so as to not relax the strained silicon-germanium lattice.

After this final thermal cycle, contact is made to the individual emitter, base and resistor contacts via standard silicide and metallzation techniques. The emitter and emitter contact is shown at 202. The base and base contact is shown at 201 and the resistor and resistor contact is shown at 203.

(For the case of the p-type substrate, contact to the collector would also be made simultaneously at this point).

Figure 10:
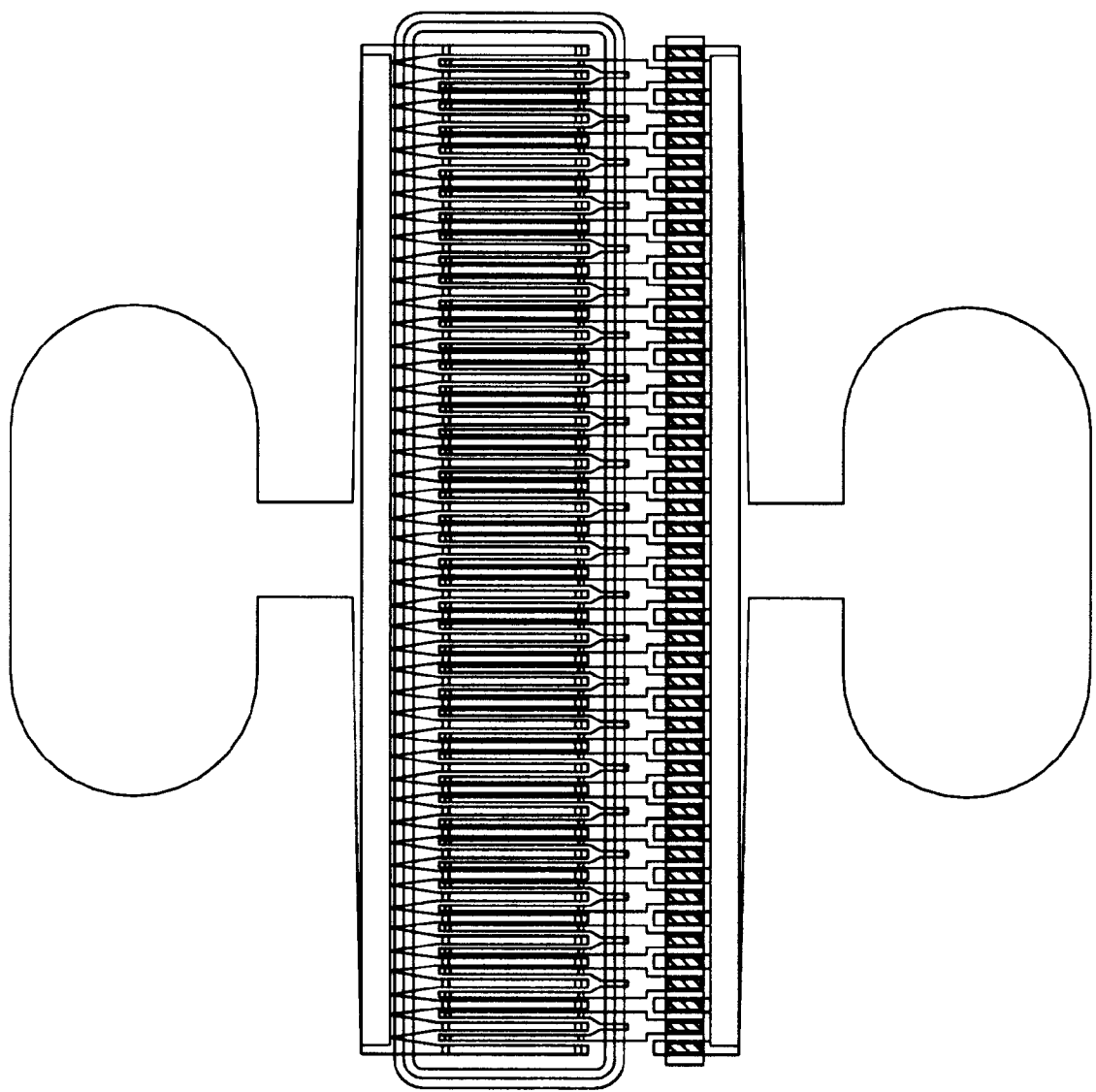
FIG. 10 is a top view of the inter-digitation of contacts for device according to the present disclosure.

The final product is shown in FIG. 2 in cross-section and in FIG. 10 as a top view. The device of the present disclosure, a high power amplifier based on Si—Ge technology, has the attendant benefits of high frequency applicability due to the superior performance characteristics of Si—Ge devices. The issues of thermal run-away are avoided by suitable ballasting with semiconductor resistors in polysilicon, while the preservation of lattice structures in Si—Ge, which are so advantageous to devices, are preserved. While the inventor has disclosed the preferred embodiment and best mode for carrying at the invention at the time of filing the application, it is clear that modifications of the teaching of the present disclosure are within the purview of the artisan of ordinary skill. Such modifications are within the scope of the invention.

I claim:

1. A heterojunction bipolar junction transistor array comprising: a plurality of transistors, each of said transistors having an emitter, a base and a collector, each of said bases being an alloy of silicon and germanium, each of said collectors and emitters being silicon; and a ballast resistor connected electrically to each of said collectors, said ballast resistors being doped silicon.

2. A transistor array as recited in claim 1, wherein each of said collectors are n-type.

3. A transistor array as recited in claim 1, wherein said array is monolithic; said collectors, said bases and said emitters of each of said transistors are in a mesa structure; and said mesa structures are isolated by localized oxidation of silicon.

4. A transistor array as recited in claim 3, wherein said polysilicon resistors have a sheet resistance on the order of 50–250 Ohm/square.

5. A heterojunction bipolar junction transistor array comprising: a plurality of transistors, each of said transistors having an emitter, a base and a collector, each of said bases being an alloy of silicon and germanium, each of said collectors and emitters being silicon; and a ballast resistor for preventing thermal runaway connected electrically to each of said collectors, said ballast resistors being boron doped silicon having a sheet resistance of 50–250 Ohm/square.

6. A transistor array as recited in claim 5, wherein each of said collectors are n-type.

7. A transistor array as recited in claim 5, wherein said array is monolithic; said collectors, said bases and said emitters of each of said transistors are in a mesa structure; and said mesa structures are isolated by localized oxidation of silicon.

8. A heterojunction bipolar junction transistor array comprising: a plurality of transistors, said array being monolithic and each of said transistors having an emitter, a base and a collector, each of said bases being an alloy of silicon and germanium, each of said collectors and emitters being silicon; a ballast resistor for preventing thermal runaway connected electrically to each of said collectors, said ballast resistors being boron doped silicon having a sheet resistance of 50–250 Ohm/square; said collectors, said bases and said emitters of each of said transistors are in a mesa structure; and said mesa structures are isolated by localized oxidation of silicon.

* * * * *